US012155392B2

(12) United States Patent
Wang et al.

(10) Patent No.: US 12,155,392 B2
(45) Date of Patent: Nov. 26, 2024

(54) CURRENT-MISMATCH COMPENSATED CHARGE PUMP FOR PHASE-LOCKED LOOP APPLICATIONS

(71) Applicant: The Regents of the University of California, Oakland, CA (US)

(72) Inventors: Hao Wang, Davis, CA (US); Omeed Momeni, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 18/247,240

(22) PCT Filed: Oct. 14, 2021

(86) PCT No.: PCT/US2021/055065
§ 371 (c)(1),
(2) Date: Mar. 29, 2023

(87) PCT Pub. No.: WO2022/125188
PCT Pub. Date: Jun. 16, 2022

(65) Prior Publication Data
US 2023/0370072 A1   Nov. 16, 2023

Related U.S. Application Data

(60) Provisional application No. 63/091,569, filed on Oct. 14, 2020.

(51) Int. Cl.
*H03L 7/089*    (2006.01)
*H03L 7/091*    (2006.01)

(52) U.S. Cl.
CPC ............ *H03L 7/0891* (2013.01); *H03L 7/091* (2013.01); *H03L 2207/06* (2013.01)

(58) Field of Classification Search
CPC ..... H03L 7/089; H03L 7/0891; H03L 7/0893; H03L 7/0895; H03L 7/0896; H03L 7/0898; H03L 7/093
See application file for complete search history.

(56) References Cited

U.S. PATENT DOCUMENTS

| 7,020,793 B1 * | 3/2006 | Hsieh ................... H03L 7/0812 713/400 |
| 9,608,644 B1 | 3/2017 | Raj et al. |
| 9,621,172 B1 | 4/2017 | Yu et al. |

(Continued)

*Primary Examiner* — Diana J. Cheng
(74) *Attorney, Agent, or Firm* — Park, Vaughan, Fleming & Dowler LLP

(57) ABSTRACT

The disclosed embodiments provide various compensated charge pumps (CPs) which have a current mismatch compensation circuitry and various CP output-current-mismatch compensation structures based on using a dummy charge pump (CPdum) and feedback loops. In some embodiments, the CPdum is identically biased as the CP to be compensated. CPdum is configured to sense the output voltage and use the feedback loops to generate compensation currents for the CP. The compensation currents simultaneously compensate CP and CPdum. Moreover, CPdum is loaded with high impedance so that the compensation current makes sure CPdum doesn't have current mismatch. Because CP and CPdum have identical biasings and are compensated in the same manner with the same amount of current, CP output current mismatch is hence effectively eliminated.

29 Claims, 10 Drawing Sheets

(56) References Cited

U.S. PATENT DOCUMENTS

| | | |
|---|---|---|
| 2013/0156076 A1 | 6/2013 | Kinget et al. |
| 2016/0118990 A1 | 4/2016 | Faisal et al. |
| 2020/0083892 A1 | 3/2020 | Kundu et al. |

* cited by examiner

CURRENT-MISMATCH COMPENSATED CHARGE PUMP FOR PHASE-LOCKED LOOP APPLICATIONS

CROSS-REFERENCE TO RELATED APPLICATION

This application claims the benefit of U.S. Provisional Patent Application Ser. No. 63/091,569, entitled "Charge Pump Current Mismatch Compensation for Sub-Sampling Phase-Locked Loop," which was filed on 14 Oct. 2020, the contents of which are incorporated by reference herein.

GOVERNMENT LICENSE RIGHTS

This invention was made with U.S. government support under grant number 1562208 awarded by the National Aeronautics and Space Administration's Jet Propulsion Laboratory (JPL). The U.S. government has certain rights in the invention.

BACKGROUND

Field

The disclosed embodiments generally relate to the design of phased-locked loops. More specifically, the disclosed embodiments relate to circuits, systems and techniques for compensating charge pump output current mismatch in phased-locked loop applications.

Related Art

Phase-locked loops (PLLs) that can lock to a wide control-voltage ($V_{ctrl}$) range of voltage-controlled oscillators (VCOs) have various benefits. With integrated circuit (IC) designs advancing into short-channel low-supply-voltage processes, analog IC blocks within PLLs, such as charge pumps (CPs) and VCOs designed for low-voltage and low-power operations face limited voltage headroom. A wide $V_{ctrl}$ locking range (LR) reduces design complexity within the limited headroom, and helps a PLL utilize more of its VCO's tuning range (TR). Moreover, individual calibration capacitor banks in the VCO's resonant tank can cover a wider frequency range with a wider $V_{ctrl}$ LR. As a result, frequency overlap between adjacent banks and hence the total number of banks can be reduced. Note that fewer banks and switches reduce loss in the VCO and increase power efficiency, especially at millimeter-wave (mm-wave) frequencies. In specialty applications such as PLL-based mm-wave and Terahertz (THz) dielectric sensing, $V_{ctrl}$ is a direct gauge of a material's complex permittivity. A wider $V_{ctrl}$ LR also means a wider sensing range and a finer resolution.

The traditional phase-frequency detector (PFD)-based PLL has been the mainstream structure to generate and synthesize accurate frequencies for many decades. However, during the past decade, sub-sampling PLLs (SSPLLs) have emerged as a favored frequency synthesis structure because of its intrinsic lower in-band phase noise (PN) than the conventional frequency-divider based PLL counterparts. However, in a practical PLL application, the $V_{ctrl}$ LR is limited by a phenomenon known as the charge pump (CP) output current mismatch (or simply "CP current mismatch") mainly caused by channel-length modulation (CLM) on output transistors. In traditional PLL designs, this current mismatch causes higher reference spur and significant CP gain distortion. In SSPLLs, this current mismatch not only induces an unwanted CP input voltage offset that limits the effective CP input range, but significantly decreases the gain of the sub-sampling phase detector (SSPD) that is used to generate the phase error.

A number of compensation techniques for traditional PLL's CP current mismatch have been proposed, which use feedback loops to adjust the CP current biasing. However, unlike the CPs using static biasing in traditional PLLs, the CP output currents in a SSPLL are controlled by a sampled signal that changes widely especially during frequency acquisition. As a result, these existing CP output current compensation techniques are not applicable in the SSPLLs.

Hence, what is needed is an output current mismatch compensation technique for CPs used in SSPLLs that does not suffer from the above-mentioned drawbacks of the existing techniques.

SUMMARY

The disclosed embodiments provide various compensated charge pumps (CPs) which have a current mismatch compensation circuitry and also various CP output-current-mismatch compensation structures and techniques based on using a dummy charge pump ($CP_{dum}$) and feedback loops. In some embodiments, the $CP_{dum}$ is identically biased as the CP to be compensated. $CP_{dum}$ is configured to sense the CP output voltage and use the feedback loops to generate compensation currents for the CP. The compensation currents simultaneously compensate CP and $CP_{dum}$. Moreover, $CP_{dum}$ is loaded with high impedance so that the compensation current makes sure $CP_{dum}$ doesn't have current mismatch. Because CP and $CP_{dum}$ have identical biasings and are compensated in the same manner with the same amount of current, CP output current mismatch is hence effectively eliminated.

In one aspect, a compensated charge pump (CP) with current mismatch compensation circuitry that compensates for CP output current mismatch effects in a phase-locked loop (PLL) is disclosed. The compensated CP includes a CP positioned within a PLL. Note that a phase difference between an input reference and an output of the PLL is converted to a varying voltage that provides an input voltage to the CP. Moreover, an output current of the CP is proportionally controlled by the input voltage. The compensated CP further includes a CP compensation structure integrated into the CP. This CP compensation structure includes: a dummy charge pump (dummy CP) that has the same transistor sizes as the CP and is identically biased with the CP; and a compensation feedback structure, which includes feedback loops that sense output voltages of the CP and the dummy CP and generate a first compensation current and a second compensation current that compensate the CP and the dummy CP, respectively.

In some embodiments, the compensation feedback structure includes an amplifier that drives a first current source and a second current source to generate the first and second compensation currents. Moreover, the first current source and the second current source are identical to each other, thereby causing the first compensation current and the second compensation current to be identical.

In some embodiments, the first current source and the second current source are transconductance current sources.

In some embodiments, the feedback loops include a first feedback loop formed by the dummy CP, the amplifier and the second current source to compensate for the current mismatch effects associated with the dummy CP using the second compensation current.

In some embodiments, the first feedback loop is a negative feedback loop.

In some embodiments, the first feedback loop is operable to force the output voltage of the dummy CP to lock to the output voltage of the CP.

In some embodiments, the feedback loops include a second feedback loop formed by the CP, the amplifier and the first current source to compensate for the current mismatch effects associated with the CP using the first compensation current.

In some embodiments, the first feedback loop is operable to compensate for the output current mismatch effects on the dummy CP when the second feedback loop is disabled.

In some embodiments, the second feedback loop is operable in conjunction with the first feedback loop to eliminate the effects of the output voltage of the CP on the output current of the CP.

In some embodiments, the dummy CP is coupled to a high impedance load to ensure the output current of the dummy CP is zero in a steady state, thereby ensuring that the dummy CP does not have a current mismatch in the steady state.

In some embodiments, during operation of the PLL, when an input differential voltage to the CP is zero, the output current of the CP is ensured to be zero after compensating the CP using the second compensation current.

In some embodiments, the dummy CP and the CP have an identical current mirroring ratio.

In some embodiments, the dummy CP and the CP have different output current mirroring ratios.

In some embodiments, the output current of the CP is a function of both the input voltage and the output voltage of the CP prior to being compensated by the first compensation current. However, the output current of the CP is a function of the input voltage of the CP but independent from the output voltage of the CP after being compensated by the first compensation current.

In some embodiments, the CP compensation structure further includes stability compensation circuitry coupled between two nodes within the compensation feedback structure. This CP compensation structure is configured to ensure operation stability and a sufficient phase margin of the compensation feedback structure.

In some embodiments, the PLL is a sub-sampling PLL, and the CP in the PLL receives the input voltage from a sub-sampling phase detector (SSPD) coupled to the input of the CP.

In some embodiments, the CP compensation structure is configured to replicate the output current mismatch effects on the CP to the output current mismatch effects on the dummy CP.

In another aspect, a sub-sampling phase-locked loop (SSPLL) including CP current mismatch compensation circuitry that compensates for CP output current mismatch effects in the PLL is disclosed. This SSPLL can include a sub-sampling phase detector (SSPD) that converts a phase difference between an input reference and an output frequency of the SSPLL into a varying voltage, and a CP coupled to the SSPD to receive the varying voltage as an input voltage to the CP, wherein an output current of the CP is proportionally controlled by the input voltage. The CP current mismatch compensation circuitry is coupled to the CP, and further includes: a dummy charge pump (dummy CP) that has the same transistor sizes as the CP and is identically biased with the CP; and a compensation feedback structure, which includes feedback loops that sense output voltages of the CP and the dummy CP and generate a first compensation current and a second compensation current that compensate the CP and the dummy CP, respectively.

In some embodiments, the compensation feedback structure includes an amplifier that drives a first current source and a second current source to generate the first and second compensation currents. The first current source and the second current source are identical to each other, thereby causing the first compensation current and the second compensation current to be identical.

In some embodiments, the SSPLL further includes a loop filter configured to convert the output current of the CP into a control voltage.

In some embodiments, the SSPLL further includes a voltage-controlled oscillator (VCO) coupled between the CP and the SSPD, wherein the VCO receives the control voltage from the CP and generates the output frequency of the PLL.

In some embodiments, the amplifier compares the control voltage and an output voltage of the dummy CP. The different between the control voltage and the output voltage of the dummy CP is used to generate the first compensation current and the second compensation current.

In some embodiments, the feedback loops include a first feedback loop formed by the dummy CP, the amplifier and the second current source to compensate for the current mismatch effects associated with the dummy CP using the second compensation current.

In some embodiments, the first feedback loop is operable to force the output voltage of the dummy CP to lock to the control voltage.

In some embodiments, the feedback loops include a second feedback loop formed by the CP, the amplifier and the first current source to compensate for the current mismatch effects associated with the CP using the first compensation current.

In some embodiments, the first feedback loop is operable to compensate for the output current mismatch effects on the dummy CP during a first time period when the CP and the second feedback loop are disabled. Note that this first time period corresponds to a sampling period of the SSPD.

In some embodiments, the second feedback loop is operable in conjunction with the first feedback loop to eliminate the effects of the control voltage of the CP on the output current of the CP during a second time period when the CP is activated, wherein the second time period corresponds to a hold period of the SSPD.

In some embodiments, the CP output current mismatch effects include a channel length modulation effect that is proportional to the control voltage.

In some embodiments, compensating for CP output current mismatch effects in the PLL increases a stability of the SSPD while reducing a gain distortion associated with the SSPD.

In some embodiments, the CP compensation structure is configured to replicate output current mismatch effects on the CP to output current mismatch effects on the dummy CP.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Figure 1:
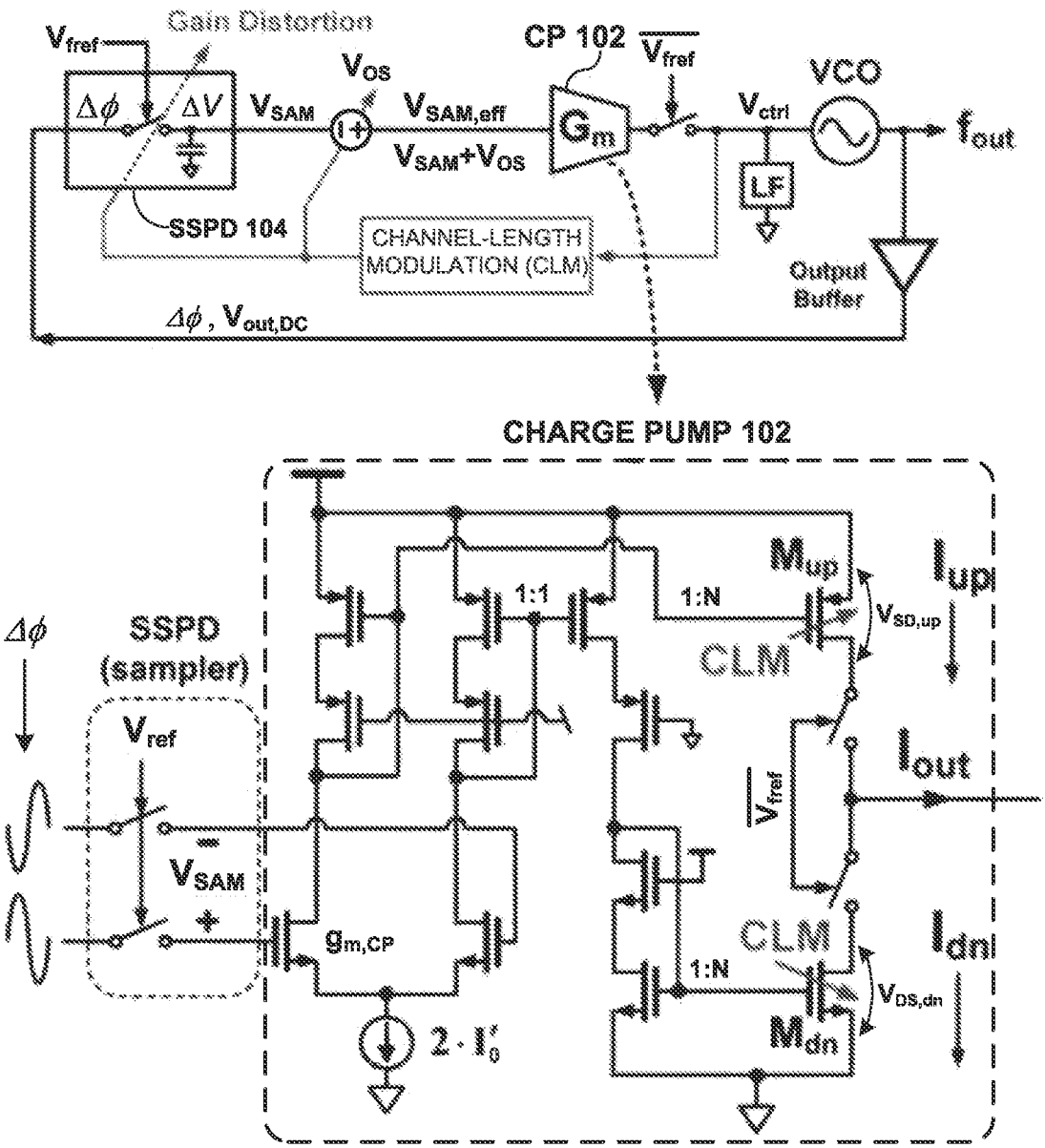
FIG. 1 shows a block diagram of a sub-sampling (SS) phase-locked loop (PLL) including a charge pump (CP) and a sub-sampling phase detector (SSPD), and a detailed circuit implementation of the CP.

FIG. 1 shows a block diagram of a sub-sampling (SS) phase-locked loop (PLL) 100 including a charge pump (CP) and a sub-sampling phase detector (SSPD), and a detailed circuit implementation of the CP. Note that SSPLL 100 does not need a traditional frequency divider in the return path. Instead, the divided-by-N function is achieved by the sub-sampling operation. As can be seen in FIG. 1, CP 102 in SSPLL 100 receives a differential input signal composed of a common-mode DC biasing and a sampled differential voltage $V_{sam}$, which is the sampled output from sub-sampling phase detector (SSPD) 104 of the VCO output. CP 102 then converts $V_{sam}$ into two channels of output currents $I_{up}$ and $I_{dn}$. Ideally, the differential output current of CP 102, $I_{out}=I_{up}-I_{dn}$ is proportional to the sample $V_{sam}$ and becomes zero when $V_{sam}$ equals zero. By observing CP 102 in FIG. 1, it can be readily understood that $I_{out}$ and hence $V_{ctrl}$ are only generated for the VCO when the output switches in CP 102, which are controlled by the inverted version $\overline{V_{fref}}$ of the sampling/hold reference signal $V_{fref}$, are turned on/activated during those time periods when $V_{fref}$ is not performing sampling operations (i.e., in the hold mode). On the other hand, $I_{out}$ and hence $V_{ctrl}$ are disabled by $\overline{V_{fref}}$ during those time periods when $V_{fref}$ is used to perform the sampling operations on SSPD 104.

However, due to the channel-length modulation (CLM) effect, depending on the value of VCO control-voltage $V_{ctrl}$, drain-source voltages $V_{SD,up}$ and $V_{DS,dn}$ of output branch transistors $M_{up}$ and $M_{dn}$ are different. The two CP currents under CLM effect can be expressed as:

$$\begin{cases} I_{up} = N \cdot \left(I'_0 + \frac{1}{2}V_{sam}g_{m,CP}\right) \cdot (1 + \lambda \cdot \Delta V_{SD,up}), \\ I_{dn} = N \cdot \left(I'_0 - \frac{1}{2}V_{sam}g_{m,CP}\right) \cdot (1 + \lambda \cdot \Delta V_{DS,dn}), \end{cases} \quad (1)$$

wherein N is the current mirroring ratio from the differential input stage of CP 102 to the output branch, $I_0'$ is the static biasing current of the CP input differential stage, $g_{m,CP}$ is the transconductance of the CP input stage, and $\lambda$ is the CLM parameter, which is assumed to be the same for both NMOS and PMOS transistors for simplicity. Assuming the CP supply voltage is $V_{DD}$ and the CP output voltage is $V_{ctrl}$ when the output switches of CP 102 are on/activated (controlled by $V_{fref}$), the drain-source voltage deviations from the standard value (i.e., $0.5V_{DD}$) of the output branch transistors $M_{up}$ and $M_{dn}$ can be computed as $\Delta V_{SD,up}=V_{SD,up}-0.5V_{DD}$ and $\Delta V_{DS,dn}=V_{DS,dn}-0.5V_{DD}$, respectively. Further defining $\Delta V_{ctrl}=V_{ctrl}-0.5V_{DD}$, and acknowledging that CP output branch biasing current $I_0=N \cdot I_0'$ and the total transconductance of CP 102 $G_{m,CP}=N \cdot g_{m,CP}$, then the net output current of CP 102, $I_{out}=I_{up}-I_{dn}$ can be calculated as:

$$I_{out}=V_{sam}G_{m,CP}-2I_0\lambda\Delta V_{ctrl}. \quad (2)$$

From Eqn. (2) it can be observed that the CLM effect induces an CP output current mismatch between $I_{up}$ and $I_{dn}$, or $\Delta I$, which is equal to the second term in Eqn. (2), i.e., $\Delta I=-2I_0\lambda\Delta V_{ctrl}$. It can be further observed that with the CLM effect, $I_{out}$ becomes dependent on $V_{ctrl}$. Even worse, Eqn. (2) suggests that a large $V_{ctrl}$ will cause a greater decrease in $I_{out}$, which is a highly undesirable effect in SSPLL 100. As will be described in more detail below, this current mismatch induces an input offset voltage to the input of CP 102, which can cause significant gain degeneration in SSPD 104 and limit the aforementioned $V_{ctrl}$ locking range (LR). Consequently, the CLM-induced CP output current mismatch needs to be compensated, especially in those systems that CLM effect is more significant.

Note that under an ideal phase-locked condition of SSPLL 100, the value of sampled output $V_{sam}$ of SSPD 104 at each sampling moment needs to be 0 to keep $V_{ctrl}$ stable/constant (i.e., when $I_{out}=0$). However, Eqn. (2) shows that the CLM effect induces a current mismatch between $I_{up}$ and $I_{dn}$. Hence, even when $V_{sam}$ is 0, $I_{out}=\Delta I$ is a function of $V_{ctrl}$ and might not be 0. This means that the current mismatch $\Delta I$ creates an effective CP input offset voltage: $V_{OS}=\Delta I/G_{m,CP}$, which is added to the $V_{sam}$. Consequently, to obtain a stable $V_{ctrl}$ and a locked frequency under the CLM effect, the effective CP input voltage $V_{sam,eff}=V_{sam}+V_{OS}$ has to be zero, so that $I_{out}$ can become 0. Note that when this stable condition is met, $V_{sam}$ becomes $-V_{OS}$ to compensate for $V_{OS}$ caused by the CLM effect at any sub-sampling moment within SSPD 104.

Figure 2:
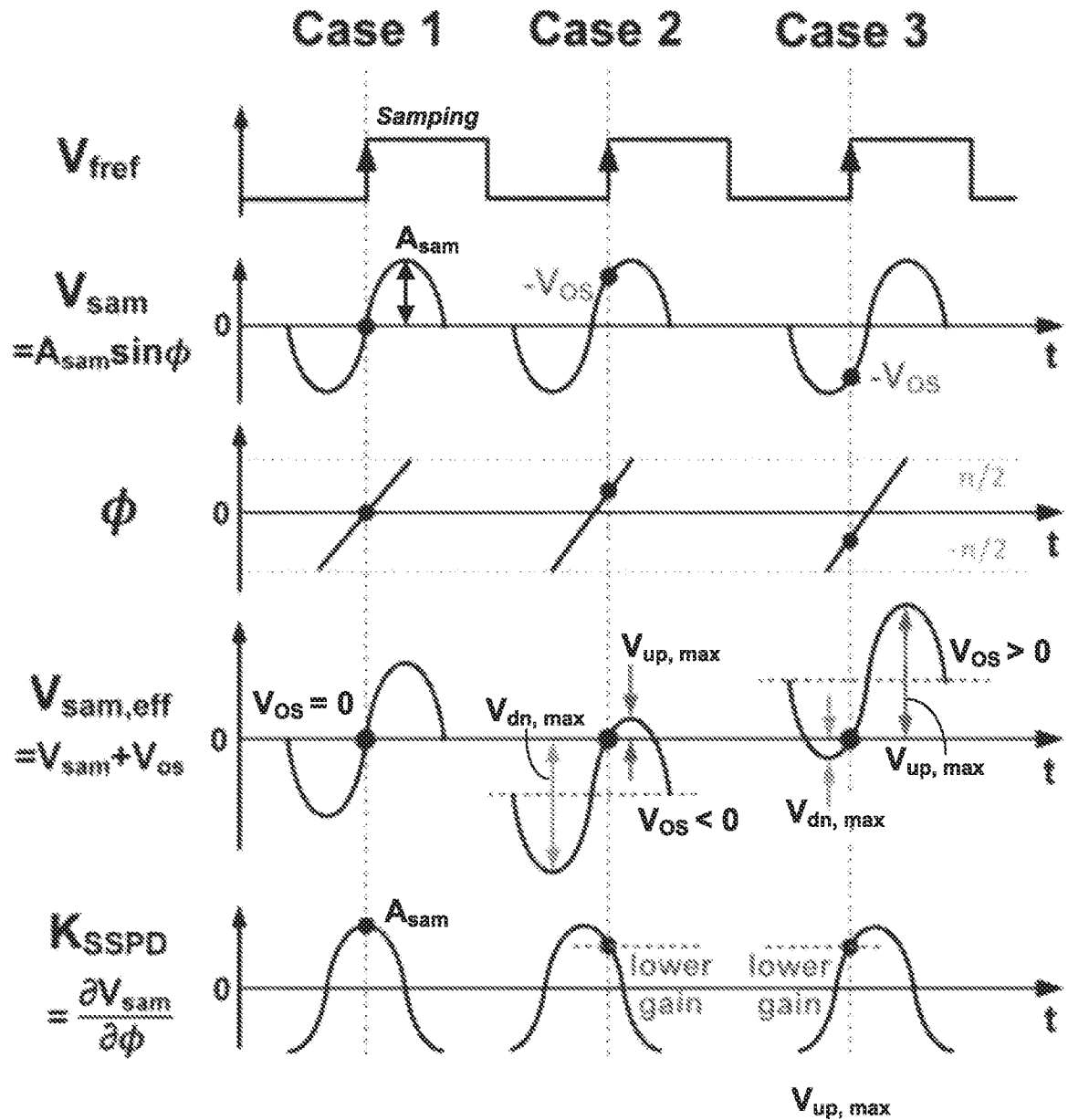
FIG. 2 illustrates different cases associated with the operations of the SSPD and the CP in a locked SSPLL.

FIG. 2 illustrates different cases associated with the operations of SSPD 104 and CP 102 in a locked SSPLL 100. $V_{sam}=A_{sam}\sin(\phi)$, wherein $A_{sam}$ is the amplitude and $\phi$ is the phase of $V_{sam}$ with respect to the sampling edge. More specifically, Case 1 in FIG. 2 corresponds to an ideal CP 102 without the CLM effect and thus $V_{OS}=0$ (i.e., $V_{sam,eff}=V_{sam}$). In this case, the SSPD 104 gain $K_{SSPD}=\partial V_{sam}/\partial \phi$ becomes $A_{sam}\cos(\phi)$. Hence, sub-sampling at $V_{sam}=0$ (i.e. $\phi=0$), allows SSPD 104 to obtain a maximum gain of $K_{SSPD}=A_{sam}$. Given that $A_{sam}$ is typically small due to high-frequency circuit losses and low-power buffer design, especially at mm-wave frequencies, sampling with the highest possible gain is almost always desired to achieve a sufficient SSPLL loop gain.

With the CP CLM effect included in Case 2, a high $V_{ctrl}$ value induces a negative $\Delta I$ and thus negative $V_{OS}$, which negatively offsets the effective CP input voltage $V_{sam,eff}$. As a result, the maximum upside value of $V_{sam,eff}$ is significantly reduced, which in turn significantly reduces a positive input range ($V_{up,max}$) for CP 102 to further increase $V_{ctrl}$. Similarly, in Case 3 with the CP CLM effect, a low $V_{ctrl}$ value induces a positive $\Delta I$ and thus positive $V_{OS}$, which positively offsets the effective CP input voltage $V_{sam,eff}$. As a result, the maximum downside value of $V_{sam,eff}$ is significantly reduced, which in turn significantly reduces a negative input range ($V_{dn,max}$) to prevent CP 102 from locking $V_{ctrl}$ to lower values. Hence, the CLM effect can significantly decrease the locking range of $V_{ctrl}$ in SSPLL 100. Moreover, for both Cases 2 and 3, SSPD gain decreases because the non-zero $V_{sam}$ and 0 generate a lower $K_{SSPD}$ at the sampling edge compared to the corresponding $K_{SSPD}$ in Case 1. This SSPD gain distortion decreases SSPLL loop gain and bandwidth, and thus degrades phase noise (PN), jitter, and loop stability of SSPLL 100.

Note that the CLM effect can be exacerbated by other factors. For example, in a cascaded SSPLL architecture using a high-frequency intermediate reference, or in an SSPLL using very narrow sampling pulses, the associated CP needs to have a faster response and a higher bandwidth. However, these designs often use even shorter-channel devices with worse CLM effect (i.e., a larger $\lambda$), resulting in even lower $V_{ctrl}$ LR and SSPD gain. Furthermore, in some low-power SSPLL designs, VCO output buffers generally produce small $A_{sam}$ values, making $V_{OS}$ values comparable to the $A_{sam}$ values when the CLM effect is significant, thereby further limiting $V_{ctrl}$ LR.

Figure 3:
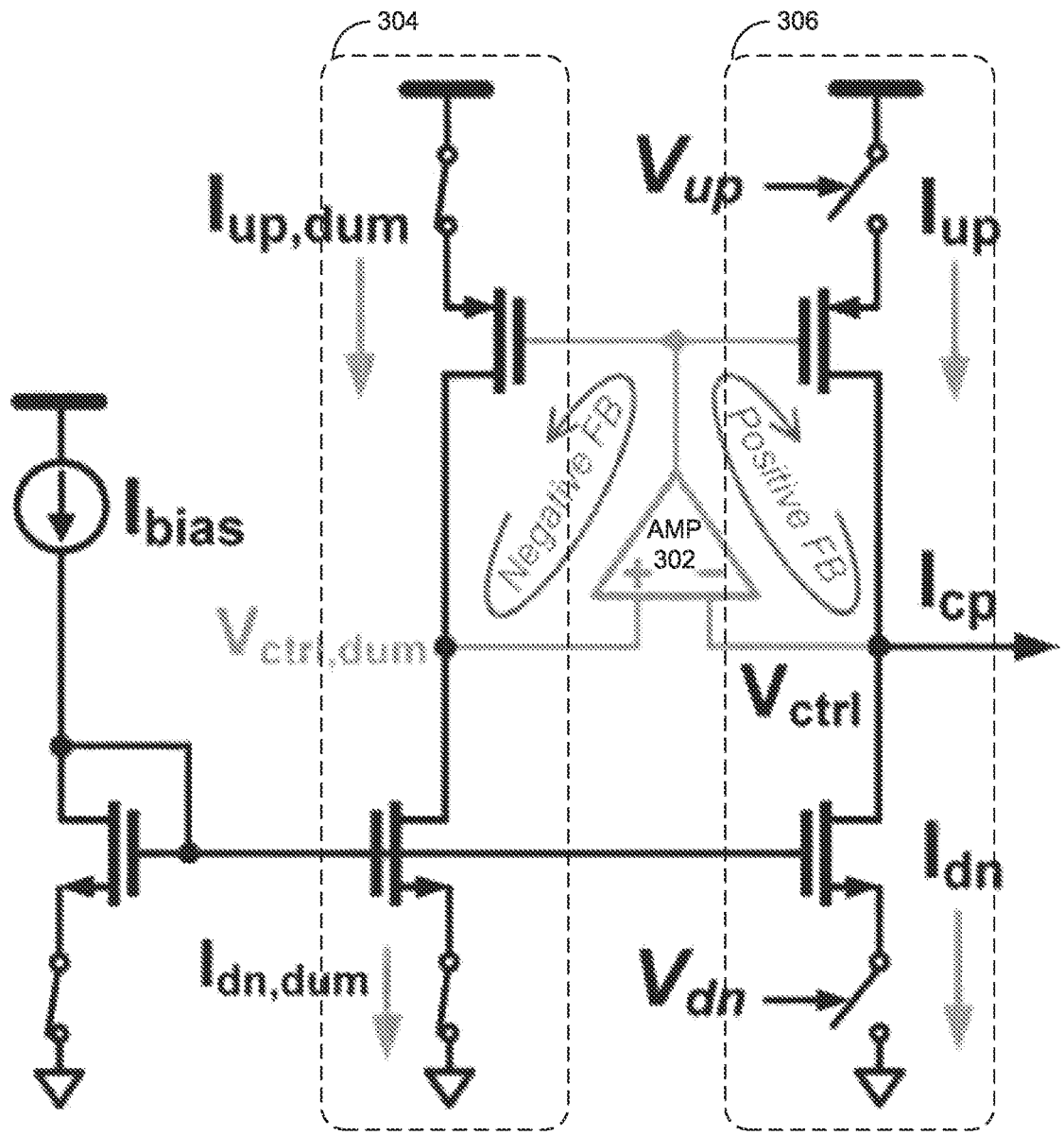
FIG. 3 shows a CP-current-mismatch compensation circuit network using feedback loops to compensate for the current mismatch in a CP.

A number of CP-current-mismatch compensation techniques based on using feedback loops have been proposed for traditional phase-frequency detector (PFD)-based PLLs. FIG. 3 shows a CP-current-mismatch compensation circuit network 300 using feedback loops to compensate for the current mismatch in a CP. As can be seen in FIG. 3, the CP output currents $I_{up}$ and $I_{dn}$ are generated based on a constant biasing current $I_{bias}$. With different $V_{ctrl}$ values, $I_{up}$ may not be equal to $I_{dn}$ due to the CLM effect. A compensation feedback includes an amplifier 302 and a dummy current branch 304 mirroring the output current branch 306, wherein the transistor sizing and biasing in the dummy current branch 304 are identical to the output branch 306, thereby ensuring $I_{up}=I_{dn}$ for any $V_{ctrl}$ value.

In a traditional PFD-based PLL, CP gain is implemented by controlling the switching signals $V_{up}$ and $V_{dn}$ to the switches in the output branch 306, and the ON time of each of the CP output currents $I_{up}$ and $I_{dn}$. The net CP output current $I_{cp}$ equals to $V_{up}$ or $V_{dn}$ depending on the values of $V_{up}$ and $V_{dn}$. Moreover, $I_{up}$ and $I_{dn}$ can only be either zero or a constant value generated by $I_{bias}$. These features of a traditional CP within a traditional PFD-based PLL make the compensation feedback easy to implement. However, as shown in FIG. 1, the output CP currents of SSPLL 100 are differentially produced by a varying voltage $V_{sam}$. For example, when $V_{sam}>0$, $I_{up}$ increases while $I_{dn}$ decreases. Thus, the CP current mismatch compensation technique 300 for the traditional PFD-based PLL is not applicable to CP 102 in SSPLL 100. Furthermore, it has been observed that CP current mismatch in the traditional PLLs typically only induces higher reference spur, without affecting the PFD gain. This is because a traditional PFD converts the received VCO phase difference into a turn-on duration for the CP output switches with a constant gain. In contrast, the SSPD within a SSPLL converts the received phase difference into a voltage signal with a variable gain that is a function of the current mismatch as described above in conjunction with FIG. 2. Hence, CP-current-mismatch compensation in SSPLLs is significantly more complex and critical to the SSPLL performance than the CP-current-mismatch compensation in traditional PLLs as shown in FIG. 3.

Figure 4:
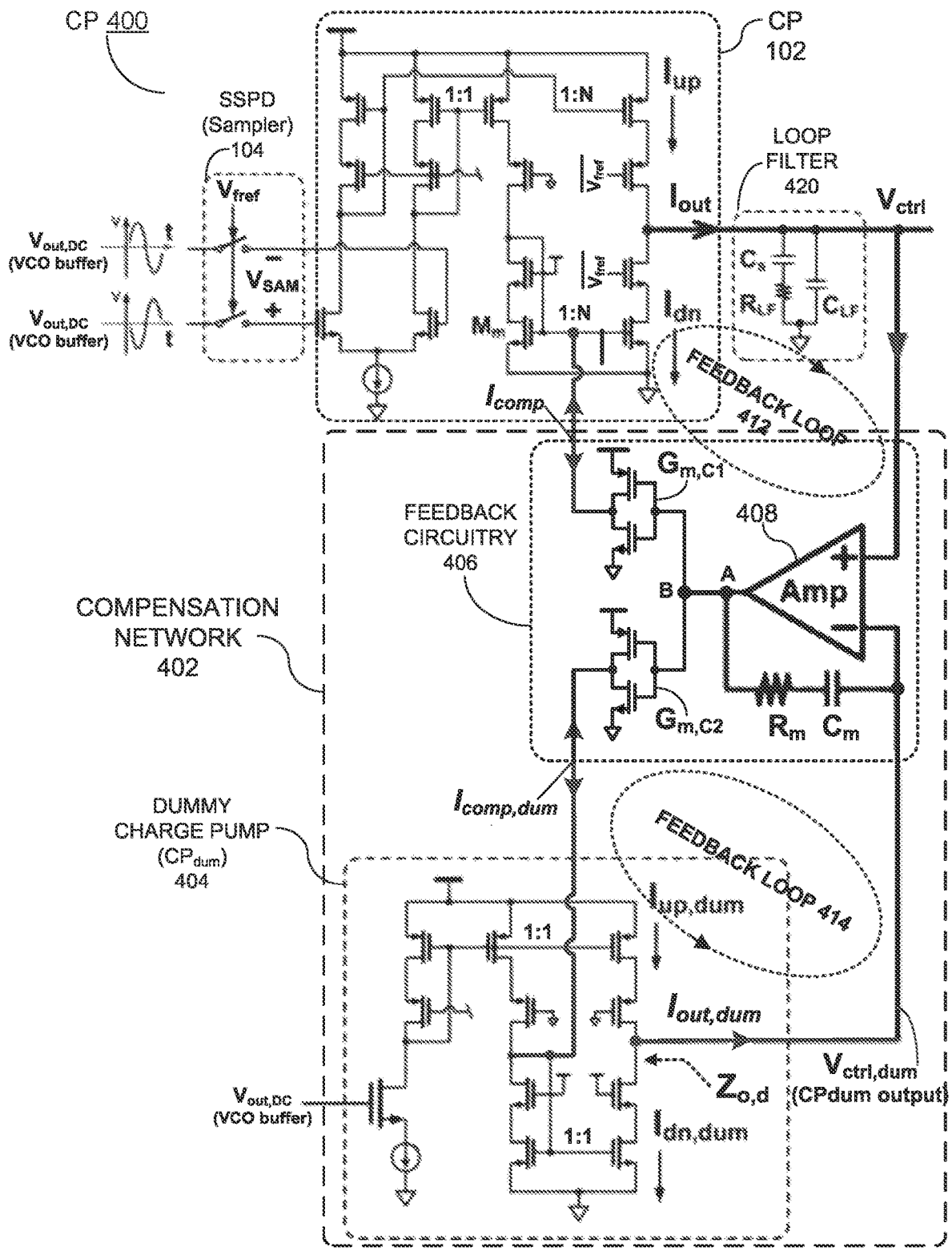
FIG. 4 shows a proposed current-mismatch compensated CP including a proposed current-mismatch compensation circuit network for a SSPLL in accordance with the disclosed embodiments.

FIG. 4 shows a proposed current-mismatch compensated CP 400 (or "compensated CP 400" hereinafter) including a proposed current-mismatch compensation circuit network 402 (or "compensation circuit network 402" or "compensation circuitry 402" or "compensation network 402" hereinafter) for SSPLL 100 in accordance with the disclosed embodiments. Note that compensated CP 400 includes a copy of CP 102 from SSPLL 100, a loop filter 420 (not shown in FIG. 1) that converts CP 102 output current $I_{out}$ into control signal $V_{ctrl}$, and compensation network 402. However, the proposed compensated CP 400 is a portion of and should be understood in the scope of the overall SSPLL 100 or any other SSPLL that can incorporate the disclosed compensation network 402 into a local CP. Note that SSPD 104, which provides DC biases and input voltage $V_{sam}$ to CP 102 is also shown in FIG. 4 for clarity purposes. However, SSPD 104 should not be considered a part of compensated CP 400.

One design concept of the disclosed current-mismatch compensation technique is to ensure when sampled output $V_{sam}=0$, CP output $I_{out}$ is also 0 for any $V_{ctrl}$ value. This design goal ensures that $I_{out}$ is not dependent on $V_{ctrl}$. In other words, the proposed mismatch compensation technique ensures that CP input offset voltage $V_{OS}$ becomes 0 so that $V_{sam}=V_{sam,eff}$, thereby effectively eliminating the CLM effect. Another design concept is based on the above observation that a larger $V_{ctrl}$ causes a greater decrease in $I_{out}$. In some embodiments, compensation network 402 can be designed such that a large $V_{ctrl}$ will cause a decrease in $I_{dn}$ while leaving $I_{up}$ unaffected. Moreover, a larger $V_{ctrl}$ will also cause a greater amount of decrease in $I_{dn}$. As a result, compensation network 402 would cause $I_{out}$ to increase as $V_{ctrl}$ increases, thereby effectively compensating for the CLM effect of $V_{ctrl}$ on $I_{out}$.

To achieve the above-described design objectives, a dummy charge pump ($CP_{dum}$) 404 (a portion of the overall compensation network 402) is added and designed with the same transistor sizes and layouts as CP 102. In some embodiments, $CP_{dum}$ 404 is an identical copy of CP 102. By using the same transistor sizes, layouts, and DC biasing in $CP_{dum}$ 404 as in CP 102, the disclosed mismatch compensation system and technique ensure that $CP_{dum}$ 404 can accurately reproduce/copy/duplicate the current mismatch of CP 102 in the output currents of $CP_{dum}$ 404. By the same token, $CP_{dum}$ 404 can also reproduce the same CLM effect that causes the current mismatch in CP 102 in the output currents of $CP_{dum}$ 404.

Note that $CP_{dum}$ 404 can also reproduce any other effect other than the CLM effect that can contribute to the current mismatch of CP 102 in the output currents of $CP_{dum}$ 404. Hence, the disclosed current mismatch compensation network 402 and the associated compensation technique are not limited to compensating for the aforementioned CLM effect on the CP output current, but any other effect that can contribute to the overall current mismatch, no matter how big or small the contribution is. However, it should be noted that the CLM effect is generally considered the primary contribution factor to the overall CP current mismatch.

In a particular embodiment of $CP_{dum}$ 404 shown in FIG. 4, $CP_{dum}$ 404 has an identical layout and transistor sizing to those of CP 102, except that the output branch current of $CP_{dum}$ 404 is mirrored to the input biasing current by a factor of 1, instead of the mirroring ratio N used as in CP 102. This small mirroring ratio of 1 allows $CP_{dum}$ 404 to have significantly lower power consumption than CP 102, thereby achieving overall power saving in the compensated CP 400. However, in other implementations of the dummy CP in the proposed compensation network 402, the dummy CP can have a current mirroring ratio M, wherein M is any integer number from 1 to N, without departing from the scope of the present technique. In some embodiments, M can be an integer number greater than N.

It can be observed in FIG. 4 that the input to $CP_{dum}$ 404 has the same DC biasing voltage as the DC biasing inputs to SSPD 104/CP 102. Combined with the identical transistor sizing and layout (other than the mirroring ratio) for both $CP_{dum}$ 404 and CP 102, the output biasing currents of CP 102 and $CP_{dum}$ 404 can be determined as $I_0 = N \cdot I_{0,dum}$ and $I_{0,dum}$, respectively. In some embodiments, compensation network 402 is configured to force $CP_{dum}$ 404 output voltage $V_{ctrl,dum}$ to accurately follow/track CP 102 output $V_{ctrl}$. This ability of $CP_{dum}$ 404 to continuously track $V_{ctrl}$ no matter how $V_{ctrl}$ varies is described in more detail below. Note also that $CP_{dum}$ 404 sees an output impedance denoted as $Z_{o,d}$, which is designed to have a very high value. This generally ensures that the output current of $CP_{dum}$ 404, $I_{out,dum}$ is zero in a steady state.

Note that compensation network 402 additionally includes a compensation/negative feedback circuitry 406 (or "feedback circuitry 406" hereinafter) which is coupled between CP 102 and $CP_{dum}$ 404. As can be seen in FIG. 4, feedback circuitry 406 receives $V_{ctrl}$ from CP 102 and $V_{ctrl,dum}$ from $CP_{dum}$ 404 as the inputs and generates two time-varying compensation currents $I_{comp}$ and $I_{comp,dum}$ as outputs. More specifically, feedback circuitry 406 contains an amplifier 408 that receives $V_{ctrl}$ at the non-inverting input; and at the same time $V_{ctrl,dum}$ at the inverting input. The output voltage of amplifier 408 then drives a pair of identical transconductive current sources $G_{m,C1}$ and $G_{m,C2}$, which generate the output currents $I_{comp}$ and $I_{comp,dum}$. Note that during a current-mismatch compensation process, $G_{m,C2}$ drains or sinks the bi-directional compensation current $I_{comp,dum}$ to control the lower output $I_{dn,dum}$ in $CP_{dum}$ 404 and to ensure $I_{up,dum} = I_{dn,dum}$. Meanwhile, $G_{m,C1}$ produces the other bi-directional compensation current $I_{comp}$ which equals $I_{comp,dum}$, wherein $I_{comp}$ is used to adjust the output biasing current in CP 102 and to ensure $I_{up} = I_{dn}$.

Note that because compensation currents $I_{comp}$ and $I_{comp,dum}$ are the two outputs from the two identical current sources $G_{m,C1}$ and $G_{m,C2}$, and both current sources are driven by the same output voltage from amplifier 408 (note: A and B are the same node), $I_{comp}$ and $I_{comp,dum}$ are identical to each other. In some embodiments, amplifier 408 is designed with a rail-to-rail input range to accommodate a wide range of $V_{ctrl}$ values. In various embodiments, amplifier 408 can be implemented with any type of differential amplifier now known or later developed. Also note that while compensation network 402 shows current sources $G_{m,C1}$ and $G_{m,C2}$ based on an transconductance implementation, other embodiments of compensation network 402 can use other types of current source to implement the two disclosed identical current sources for generating $I_{comp}$ and $I_{comp,dum}$, without departing from the present scope.

Note that compensated CP 400 includes two feedback loops which both include feedback circuitry 406: a first feedback loop 412 formed between feedback circuitry 406 and CP 102; and a second feedback loop 414 formed between feedback circuitry 406 and $CP_{dum}$ 404. The two feedback loops are operable to compensate for the current mismatches in CP 102 and $CP_{dum}$ 404 at all time. In some embodiments, for any value of $V_{ctrl}$ output from CP 102, the second feedback loop 414 operates as a classical negative feedback loop to lock $CP_{dum}$ 404 output voltage $V_{ctrl,dum}$ to $V_{ctrl}$. Specifically, feedback circuitry 406 receives a varying $V_{ctrl}$ at the non-inverting input of amplifier 408. Assuming the value of $V_{ctrl}$ has just increased, feedback circuitry 406 subsequently generates a new compensation current $I_{comp,dum}$ whose value increases in response to the new $V_{ctrl}$.

The increased compensation current $I_{comp,dum}$ is fed to $CP_{dum}$ 404 as part of feedback loop 414 to cause the biasing current in $CP_{dum}$ 404 to increase, which in turn increases $I_{up,dum}$ and $I_{dn,dum}$, and as a result, also increases $V_{ctrl,dum}$. As another result, the difference between $V_{ctrl,dum}$ and new $V_{ctrl}$ is reduced. The increased $V_{ctrl,dum}$ from $CP_{dum}$ 404 is then fed back into the inverting input of amplifier 408 and compared with the new $V_{ctrl}$ at the other input. Note that this process within feedback loop 414 continues until $V_{ctrl,dum} = V_{ctrl}$, i.e., $V_{ctrl,dum}$ is locked to $V_{ctrl}$ and the feedback loop reaches a stable condition. At this point, $CP_{dum}$ 404 within feedback loop 414, which receives $V_{ctrl}$ as the only external input has fully compensated for the output current mismatch caused by $V_{ctrl}$, including the $V_{ctrl}$-dependent CLM effect. As a result, $I_{up,dum} = I_{dn,dum}$ is achieved in $CP_{dum}$ 404. Note that control input $\overline{V_{fref}}$ to the output switches of CP 102 ensures that when $V_{ctrl,dum}$ is in the process to lock to $V_{ctrl}$ in feedback loop 414, feedback loop 412 is disabled by deactivating the output switches of CP 102. This ensures that $V_{ctrl}$ is the only external input signal received by feedback loop 414. Note that the time period when the output switches of CP 102 are deactivated also corresponds to a sampling period of SSPD 104 when SSPD 104 is performing sampling actions.

After $I_{up,dum}=I_{dn,dum}$ and $V_{ctrl,dum}=V_{ctrl}$ have been achieved in $CP_{dum}$ 404, the current-mismatch compensation operation of compensation network 402 proceeds to compensate for the output current mismatch in CP 102 caused by $V_{ctrl}$. More specifically, $\overline{V_{fref}}$ turns on/activates the output switches of CP 102, which enables feedback loop 412. As such, both feedback loops in compensated CP 400 are now active and work together to compensate for the output current mismatch in CP 102. Note that the time period when the output switches of CP 102 are activated also corresponds to a hold period of the SSPD 104 when SSPD 104 is not performing sampling actions.

Note that during the time period when both feedback loops are active, because CP 102 and $CP_{dum}$ 404 have identical layouts, transistor sizing, and DC biasing, and $I_{up,dum}=I_{dn,dum}$ and $V_{ctrl,dum}=V_{ctrl}$ remain true in feedback loop 414, feedback loop 412 operates in exactly the same manner as feedback loop 414 described above by using compensation current $I_{comp}$ that has been adjusted to the right value to cause CP 102 output currents $I_{up}=I_{dn}$. Note that the identical compensation current $I_{comp,dum}$ has just been used to achieve the CP-current mismatch compensation for $CP_{dum}$ 404 in feedback loop 412. Consequently, the CP-current mismatch caused by $V_{ctrl}$ in CP 102 including the $V_{ctrl}$-dependent CLM effect is compensated.

Generally speaking, when $V_{sam}=0$, CP 102 and $CP_{dum}$ 404 have the same biasing condition and are compensated by the respective feedback loop 412 and 414 in the same manner. As described above, in the negative feedback loop 414, the high impedance load of $CP_{dum}$ 404, and compensation current $I_{comp,dum}$ ensure that $I_{up,dum}=I_{dn,dum}$ and $V_{ctrl,dum}=V_{ctrl}$ in the dummy charge pump 404. This means the current mismatch effects caused by $V_{ctrl}$ are eliminated in $CP_{dum}$ 404. By the take token, compensation current $I_{comp}$ which is identical to the value of compensation current $I_{comp,dum}$ that was just used to compensate the current mismatch in $CP_{dum}$404, can also ensure that $I_{up}=I_{dn}$ in CP 102 for any $V_{ctrl}$ as long as $V_{sam}=0$, thereby eliminating the current mismatch in CP 102. Consequently, the CP-current mismatch and the effective $V_{OS}$ caused by $V_{ctrl}$ including the $V_{ctrl}$-dependent CLM effect in CP 102, along with the associated SSPD gain distortion, are effectively cancelled.

Using the above-disclosed CP-current mismatch compensation technique, the net output current of CP 102 can be calculated based on Eqn. (2) as:

$$I_{out}=V_{sam} \cdot G_{m,CP}+\Delta I - I_{comp} \cdot N(1+\lambda \Delta V_{ctrl}), \quad (3)$$

wherein $\Delta I=-2I_0 \lambda \Delta V_{ctrl}$. Because transistors in $CP_{dum}$ 404 are identical to those in CP 102, the $CP_{dum}$ 404 output current $I_{out,dum}$ can be evaluated from Eqn. (3) under conditions of $V_{sam}=0$ and N=1. Note that in a steady state, $I_{out,dum}=\Delta I_{dum}-I_{comp,dum} \cdot (1+\lambda \Delta V_{ctrl,dum})=0$. Due to the two symmetric feedback loops created by feedback circuitry 406, the identical transistor sizing, the identical biasing, and the identical $G_{m,c1}$ and $G_{m,C2}$, the disclosed compensation network 402 ensures that $\Delta I_{dum}=\Delta I/N$, $I_{comp,dum}=I_{comp}$ and $V_{ctrl,dum}=V_{ctrl}$. Hence, the second and the third terms in Eqn. (3), i.e., $\Delta I - I_{comp} \cdot N(1+\lambda \Delta V_{ctrl})$ becomes 0 and the compensated CP 102 output current becomes: $I_{out}=V_{sam} \cdot G_{m,CP}$. This means that the compensation current $I_{comp}$ completely cancels out the mismatch current $\Delta I$ in CP 102 caused by $V_{ctrl}$ including $V_{ctrl}$-dependent CLM effect, and as a result the CP 102 input offset voltage $V_{OS}$ and SSPD gain degeneration in the SSPLL 100, are all eliminated.

Figure 5:
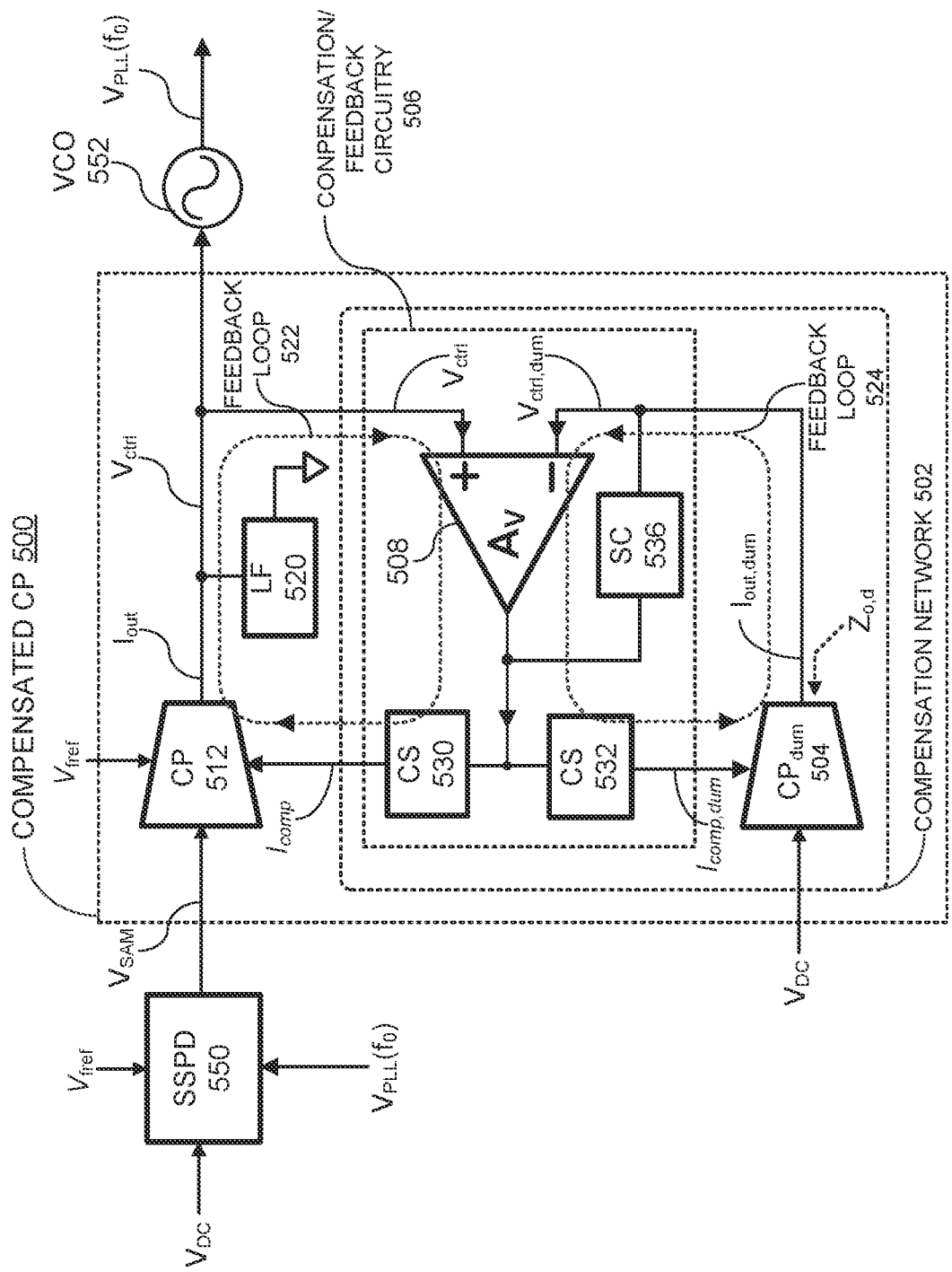
FIG. 5 shows a block diagram illustrating the disclosed output-current-mismatch compensated CP including the disclosed current-mismatch compensation network for use in a SSPLL in accordance with the disclosed embodiments.

FIG. 5 shows a block diagram illustrating the disclosed output-current-mismatch compensated CP 500 including the disclosed current-mismatch compensation network 502 for use in an SSPLL in accordance with the disclosed embodiments. As can be seen in FIG. 5, output-current-mismatch compensated CP 500 ("mismatch compensated CP 500" hereinafter) includes a CP 512 and a mismatch compensation network 502 ("compensated network 502" hereinafter). CP 512 can be any type of charge pump having an output current that is proportionally controlled by an input voltage $V_{sam}$ to CP 512. In the embodiment shown, $V_{sam}$ is the sub-sampled output of a SSPD 550 by a sampling reference signal $V_{fref}$, wherein SSPD 550 is not a part of the mismatch-compensated CP 500. Note that sampling reference signal $V_{fref}$ is also a control input to CP 512. Moreover, the output current $I_{out}$ of CP 512 is a differential output current of two output currents $I_{up}$ and $I_{dn}$ (not shown).

Note that compensation network 502 generates a compensation current $I_{comp}$, which is the compensation input to CP 512 to compensate for the output-current-mismatch in output current $I_{out}$. FIG. 5 shows that a loop filter (LF) 520 is used to convert CP 512 output current $I_{out}$ into output voltage $V_{ctrl}$, which is the input signal to compensation network 502 and used by network 502 to generate compensation current $I_{comp}$. Note that LF 520 is a part of the mismatch-compensated CP 500. Note also that $V_{ctrl}$ is the control voltage for a local voltage-controlled oscillator (VCO) 552, which generates a synthesized frequency $f_0$. A portion of the VCO 552 output voltage $V_{PLL}(f_0)$ is the feedback input to SSPD 550.

Compensation network 502 includes a dummy charge pump ($CP_{dum}$) 504 that is configured with the same circuit layouts and transistor sizing as CP 512. In some embodiments, $CP_{dum}$ 504 is an identical copy of CP 512. In other embodiments, $CP_{dum}$ 504 is substantially identical to CP 512 expect that $CP_{dum}$ 504 and CP 512 can have different current mirroring ratios and hence different power consumptions. Moreover, $CP_{dum}$ 504 and CP 512 can have the same input DC biasing $V_{DC}$. Note that this input DC biasing can be the extracted DC component in VCO 552 output voltage $V_{PLL}(f_0)$. Note also that by using the same layouts, transistor sizing and DC biasing in $CP_{dum}$ 504 as CP 512, compensated CP 500 ensures that $CP_{dum}$ 504 can reproduce the output current mismatch of CP 512 in the output currents of $CP_{dum}$ 404. By the same token, $CP_{dum}$ 504 can also reproduce the same CLM effect that causes the current mismatch in CP 512 in the output currents of $CP_{dum}$ 504.

Compensation network 502 also includes compensation/feedback circuitry 506 that is coupled between CP 502 and $CP_{dum}$ 504. As can be seen in FIG. 5, compensation/feedback circuitry 506 further comprises a differential amplifier 508 and a pair of identical current sources CS 530 and CS 532. Amplifier 508 is used to receive $V_{ctrl}$ from CP 502 output, and $V_{ctrl,dum}$ from $CP_{dum}$ 504 output. Note also by coupling the output of $CP_{dum}$ 504 to an input of amplifier 508, compensation/feedback circuitry 506 ensures that $CP_{dum}$ 504 has a very high impedance load, denoted $Z_{o,d}$. This generally ensures that the output current of $CP_{dum}$ 504, $I_{out,dum}$ to be zero in a steady state. The output voltage of amplifier 508 then drives CS 530 and CS 532 to generate two identical and time-varying compensation currents $I_{comp}$ and $I_{comp,dum}$. As mentioned above, compensation current $I_{comp}$ is the compensation input to CP 512 while $I_{comp,du}$m is the compensation input to $CP_{dum}$ 504.

Compensation/feedback circuitry 506 can also include stability compensation circuitry (SC) 536 coupled between the output and the inverting input of amplifier 508 and configured to ensure the operation stability and sufficient phase margin of compensation/feedback circuitry 506. In some embodiments, SC 536 can be implemented as Miller compensation resistor $R_M$ and capacitor $C_M$ as shown inside feedback circuitry 406 used by compensated CP 400. These Miller compensation components are added to ensure the stability and sufficient phase margin of compensation/feedback circuitry 506. However, embodiments of SC 536 are not limited to Miller compensation structures, and the coupling configuration of SC 536 for stability compensation is not limited to between the negative input and the output of amplifier 408.

Note that compensated CP 500 includes two feedback loops: a first feedback loop 522 including amplifier 508, CS 530 and CP 512; and a second feedback loop 524 including amplifier 508, CS 532 and $CP_{dum}$ 504. In some embodiments, compensated CP 500 performs current-mismatch compensation in two consecutive phases with a time-control provided by sampling reference signal $V_{fref}$. More specifically, in the first phase of the compensation operation, CP 512 is deactivated by $V_{fref}$, which also disables feedback loop 522. As such, feedback loop 524 operates as a classical negative feedback loop and uses a varying $I_{comp,dum}$ to lock $CP_{dum}$ 504 output voltage $V_{ctrl,dum}$ to $V_{ctrl}$ for any value of $V_{ctrl}$ during the first phase of the compensation operation. In addition, the first phase of the compensation operation also results in a stable state of $CP_{dum}$ 504, such that $CP_{dum}$ 504 output current $I_{out,dum}=0$. The first phase of the compensation operation using time-varying compensation current $I_{comp,dum}$ and feedback loop 524 has been described in detail above in conjunction with FIG. 4. At the end of the first phase of the compensation operation, the output current mismatch caused by $V_{ctrl}$ in $I_{out,dum}$ including the $V_{ctrl}$-dependent CLM effect is fully compensated and hence eliminated.

Next, in the second phase of the compensation operation, CP 512 is activated by $V_{fref}$ which also enables feedback loop 522. As such, both feedback loops in compensated CP 500 are now active and work together to compensate for the output current mismatch in CP 512. Note that because CP 512 and $CP_{dum}$ 504 have the identical layouts, transistor sizing, and DC biasing, and $I_{out,dum}=0$ and $V_{ctrl,dum}=V_{ctrl}$ remain true in feedback loop 524, feedback loop 522 operates in exactly the same manner as feedback loop 524 by using compensation current $I_{comp}$ (which has the same value as $I_{comp,dum}$ that caused $I_{up,dum}=I_{dn,dum}$) to cause CP 512 output currents $I_{up}=I_{dn}$. Consequently, the CP-current mismatch caused by $V_{ctrl}$ in the local CP 512, including the $V_{ctrl}$-dependent CLM effect, along with the associated SSPD gain distortion, are fully compensated and effectively eliminated.

Figure 6:
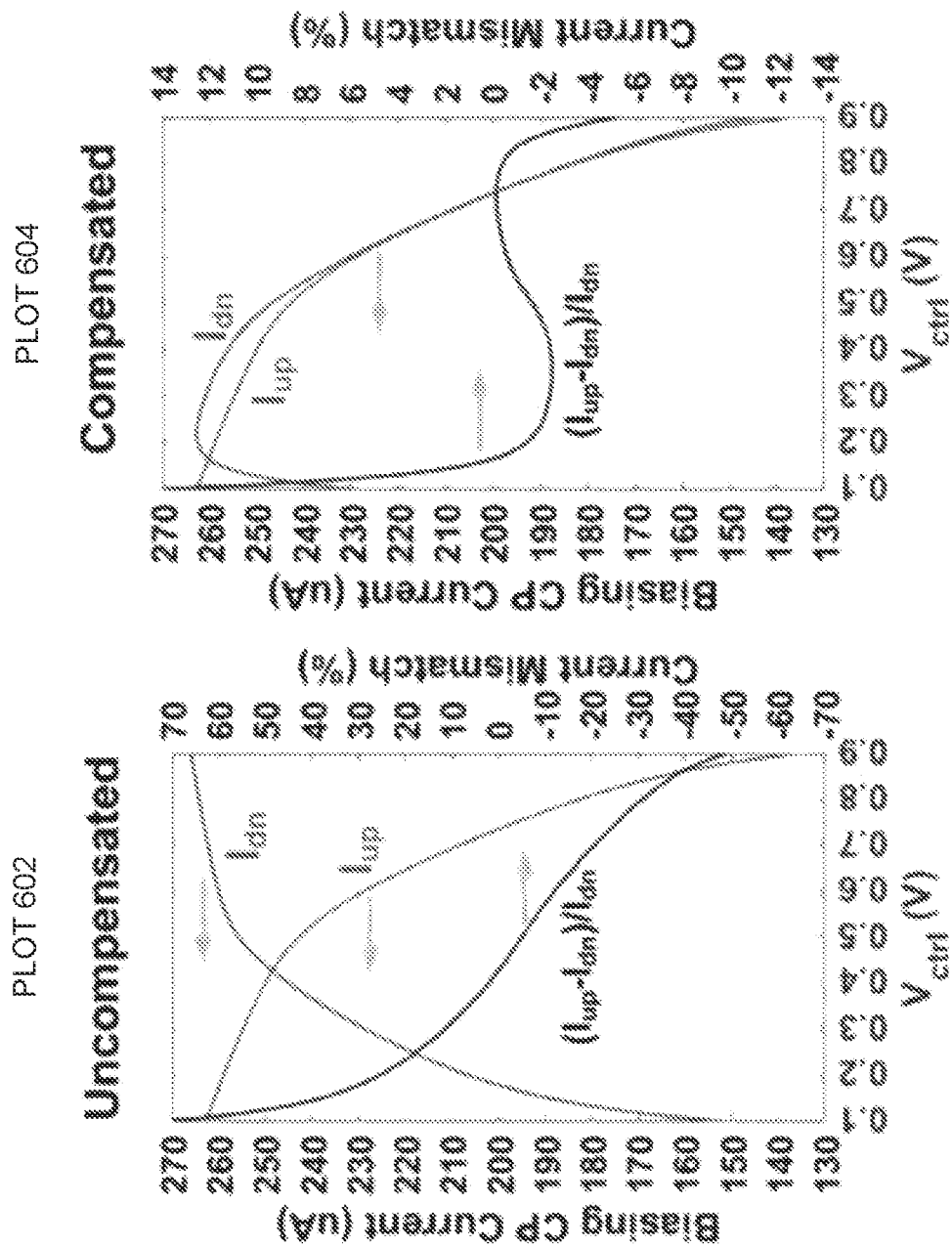
FIG. 6 shows the comparison of the simulated current mismatch of a CP for a SSPLL with and without the disclosed compensation network in accordance with the disclosed embodiments.

FIG. 6 shows a comparison of the simulated current mismatch of a CP for a SSPLL with and without the disclosed compensation network 402 in accordance with the disclosed embodiments. As can be seen in FIG. 6, the $V_{ctrl}$ range used for the simulations is from 0.1V to 0.9V, which is a reasonable range of operation for the output transistors in the disclosed CPs. The uncompensated results of plot 602 in FIG. 6 showed that the uncompensated current mismatch spans from −50% to 70%. In contrast, the compensated results of plot 604 in FIG. 5 showed that the compensated current mismatch is significantly reduced to −4% to 14%.

Figure 7:
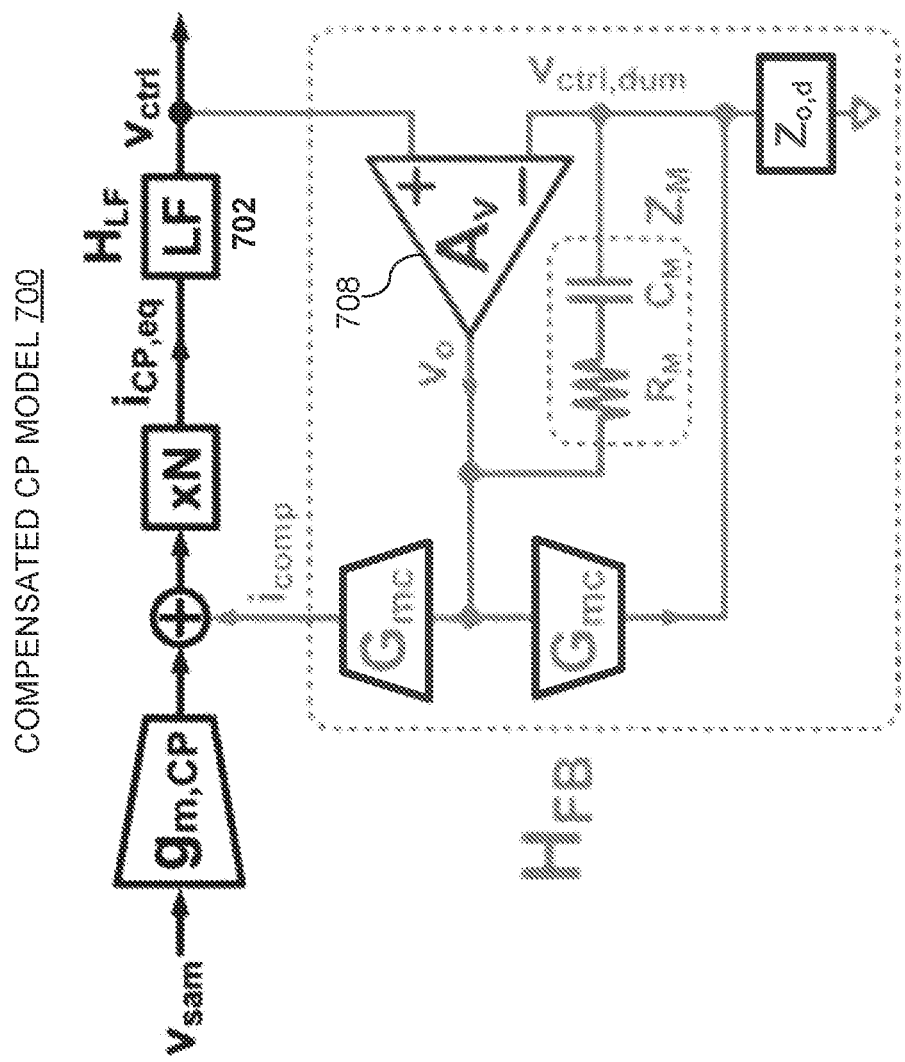
FIG. 7 shows a block diagram model of the disclosed compensated CP including both the disclosed compensation network and a LF network in accordance with the disclosed embodiments.

Note that to derive the transfer function of the proposed compensated CP 400, a loop filter (LF) needs to be included. As can be seen in FIG. 4, a LF 420 is coupled between the output node of CP 102 and the input node of compensation network 402, and generates the filtered output $V_{ctrl}$, which is the input to the compensation network 402. FIG. 7 show a block diagram model 700 of the disclosed compensated CP 400 including both the disclosed compensation network and a LF network 702 in accordance with the disclosed embodiments. In the compensated CP model 700, CP 102 is represented by a trapezoid box denoted with $G_{m,CP}$, the rail-to-rail voltage gain of amplifier 708 is denoted as $A_V$, and the signal path from the amplifier output $V_O$, to CP 102 output current has an equivalent transconductance of $N \cdot G_{mc}$, wherein $G_{mc}=G_{m,C1}=G_{m,C2}$. The signal path from amplifier output $V_O$, to the output of the dummy CP $CP_{dum}$ can be modeled as a transconductor with gain of $G_{mc}$ loaded with the output impedance of $CP_{dum}$, which is denoted $Z_{o,d}$.

After deriving the compensation feedback transfer function, HFB(s), (see Appendix A), we can express the total equivalent transfer function of the proposed compensated CP 400 combined with the LF 702 in FIG. 7 as:

$$H_{eq}(s) = \frac{v_{ctrl}}{v_{sam}} = \frac{N \cdot g_{m,CP} \cdot H_{LF}}{1 - N \cdot H_{LF} H_{FB}}. \tag{4}$$

Given that the transconductance of CP 102 is $G_{m,CP}= N \cdot g_{m,CP}$, compensated CP model 700 can be rearranged into a more straightforward model for easier analysis, especially for analyzing noise behavior in a relevant section below.

Figure 8:
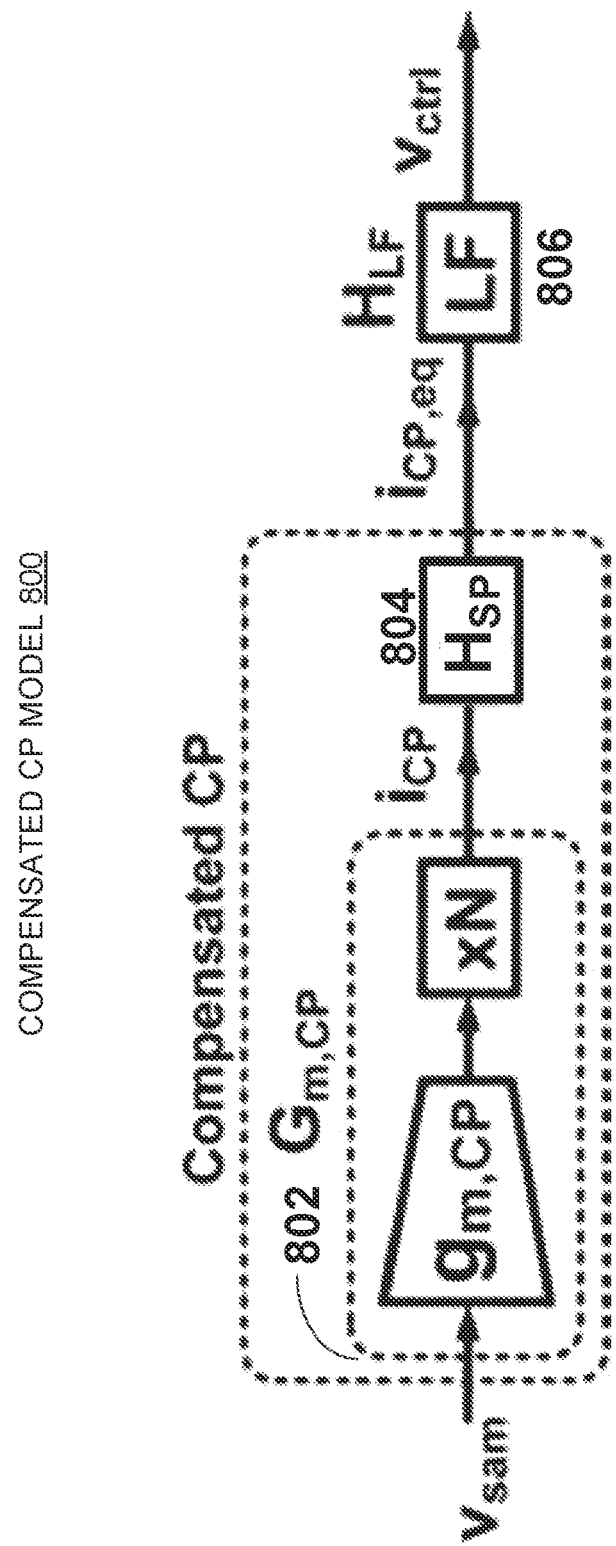
FIG. 8 shows a simplified model of the disclosed compensated CP in accordance with the disclosed embodiments.

FIG. 8 shows a simplified model 800 of the disclosed compensated CP in accordance with the disclosed embodiments. As can be seen in FIG. 8, simplified compensated CP model 800 includes a CP 802 without the CLM effect, a shaping block 804 induced by the compensation, and an LF 806, all coupled in series. The transfer function $H_{SP}(s)$ of shaping block 804 can be derived as:

$$H_{SP}(s) = \frac{H_{eq}}{G_{m,CP} H_{LF}} = \frac{1}{1 - N \cdot H_{LF} H_{FB}}. \tag{5}$$

Figure 9:
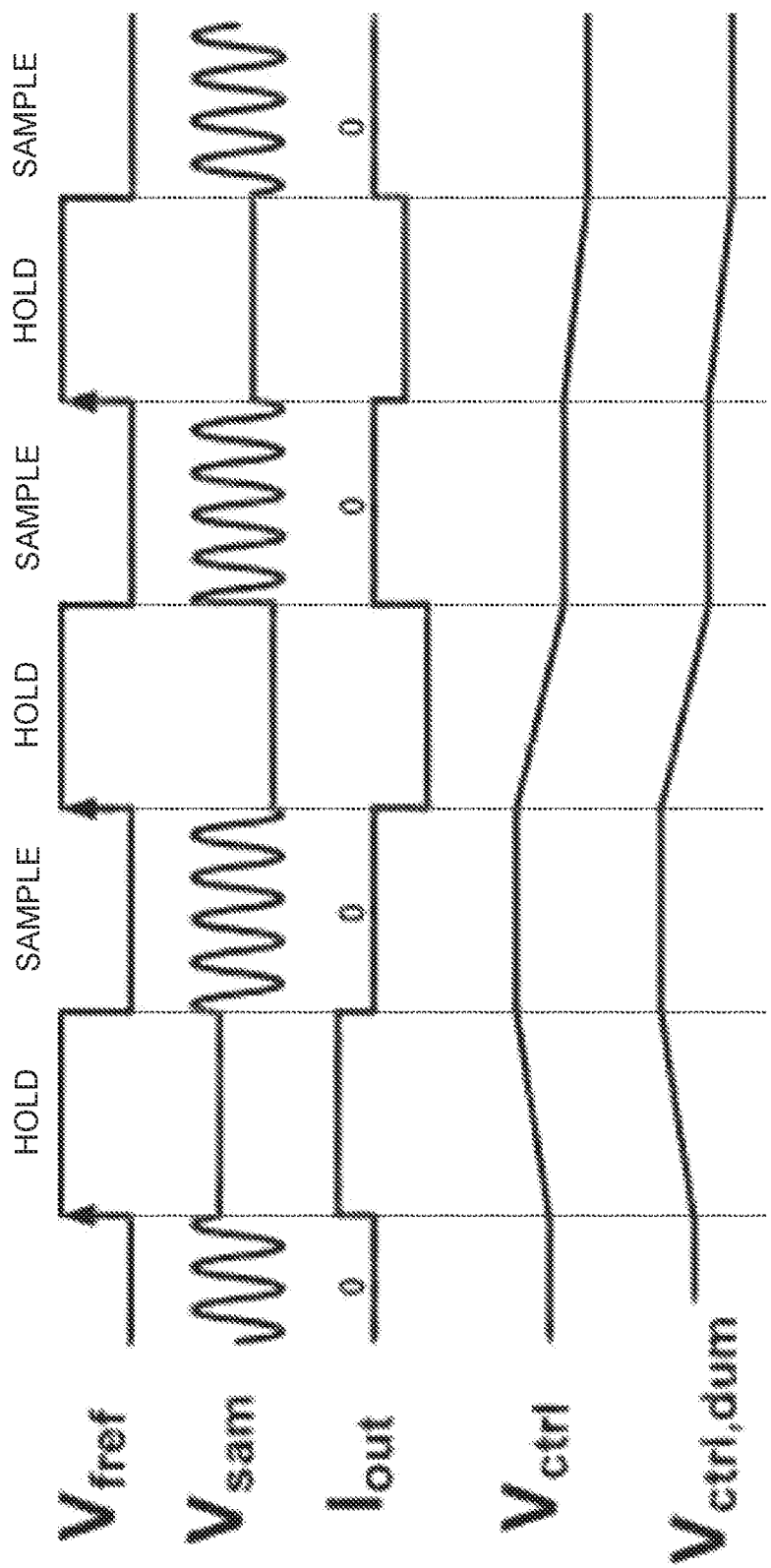
FIG. 9 illustrates waveforms of various important signals in a SSPLL in accordance with the disclosed embodiments.

Note that unlike the CP of a traditional PLL, $I_{out}$ of CP 102 in SSPLL 100 is controlled by input voltage $V_{sam}$ in the time-domain. FIG. 9 illustrates waveforms of various important signals in SSPLL 100 in accordance with the disclosed embodiments. As can be seen in FIG. 9, $V_{sam}$ is periodically sampled and held by reference signal $V_{fref}$. Moreover, during each "sample" period of $V_{fref}$, the output switches of CP 102 are turned off, hence $I_{out}$ is disconnected from the LF and $V_{ctrl}$ maintains its prior value. Furthermore, during each "hold" period of $V_{fref}$, $V_{sam}$ maintains its sampled value, $I_{out}$ is generated based on Eqn. (2) and fed into the LF to change $V_{ctrl}$. When designing the CP compensation, the following conditions should also be ensured:

$V_{ctrl,dum}$ follows $V_{ctrl}$ sufficiently fast to allow timely compensation. This condition can be ensured by designing the compensation loop with sufficiently high gain and bandwidth; and The compensation must be stable during operation. This condition can be ensured by adding Miller compensation resistor $R_M$ and capacitor $C_M$ for operating within a good phase margin. The bandwidth of the compensation loop doesn't have to be as wide as the frequency of the SSPLL reference.

During frequency acquisition, $V_{ctrl}$ changes abruptly at each sampling edge as shown in FIG. 12 below. If $V_{ctrl,dum}$ can generally follow the average value of $V_{ctrl}$, instead of the instantaneous $V_{ctrl}$ value, the current mismatch can be safely compensated.

Figures 10A, 10B:
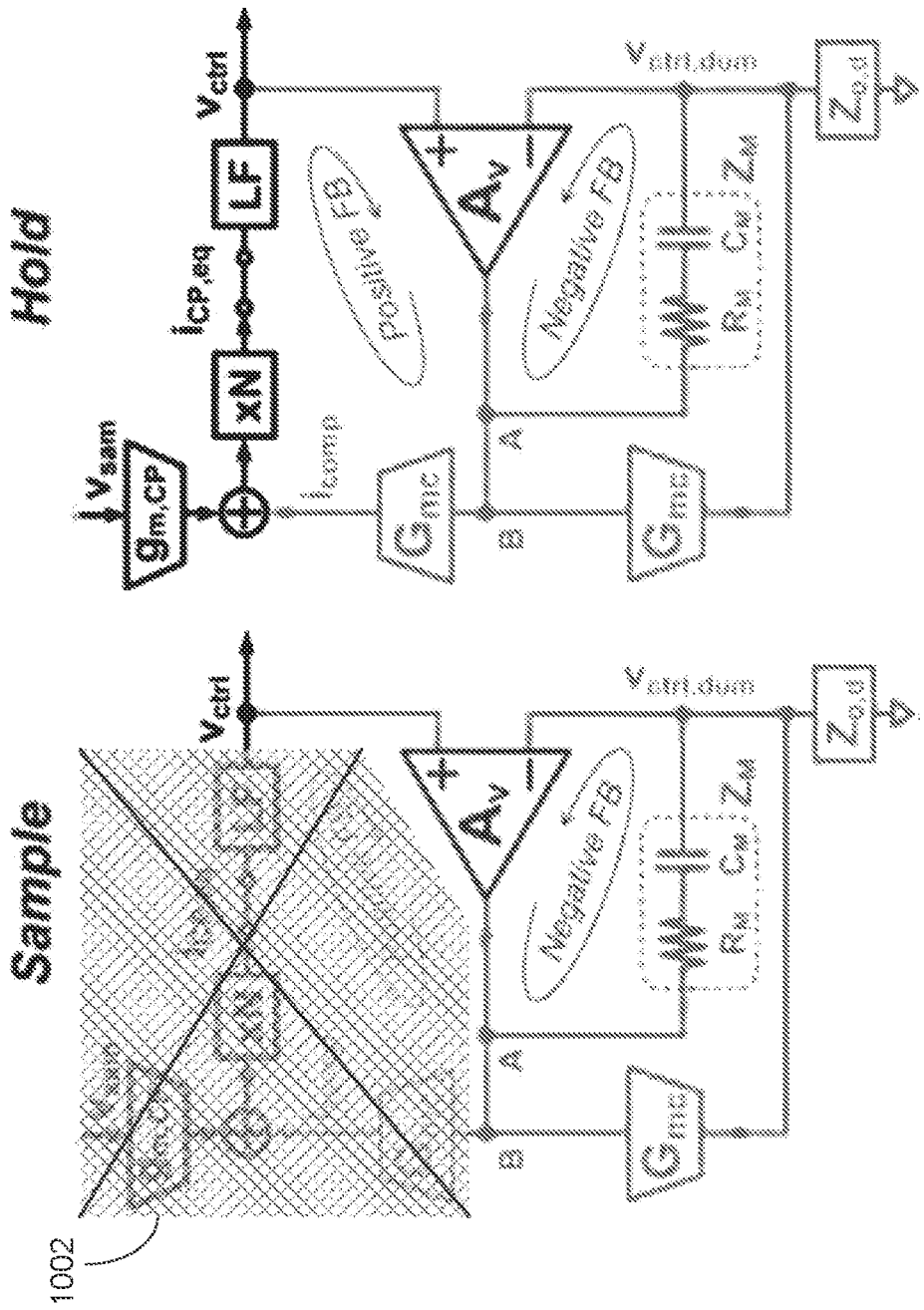
FIGS. 10A and 10B show equivalent block diagrams of the proposed CP compensation network for the "sample" and "hold" periods of $V_{fref}$, respectively in accordance with the disclosed embodiments.

FIGS. 10A and 10B show equivalent block diagrams of the proposed CP compensation network for the "sample" and "hold" periods of $V_{fref}$, respectively in accordance with the disclosed embodiments. It can be observed from FIGS. 10A and 10B that, similar to the traditional CP compensation technique of FIG. 3, the proposed compensation technique establishes negative and positive feedback loops during each sample-hold period. During a "sample" period shown in FIG. 10A, the positive feedback loop is disabled (indicated by the grayed-out and crossed-out box 1002) because CP 102 and the LF are disconnected, and stability can be simply achieved with the above-described Miller compensation. However, during a "hold" period shown in FIG. 10B, both the positive loop and negative feedback loop operate concurrently. In some embodiments, to ensure stable operation during the hold period, overall loop gain and phase change of the dual-loop network are configured to satisfy the Barkhausen stability criterion. Because the positive and negative feedback loops share the same signal path from node A to node B labeled in FIGS. 10A and 10B, a probe can be inserted between nodes A and B to simulate the network's loop gain, phase and stability.

This disclosure proposed a current mismatch compensation network for a local CP in a SSPLL to mitigate the transistors' CLM effect on the CP output current. In some embodiments, the mismatch compensation network is composed of a dummy CP identical to the local CP, and a rail-to-rail amplifier-based compensation feedback. Using the proposed structure, the proposed mismatch compensation network can generate two identical compensation currents and cancel out CLM-induced CP output current mismatch. As a result, both SSPD gain degeneration and an unwanted CP input voltage offset are eliminated, and hence the compensated SSPLL can lock with a much wider range of $V_{ctrl}$. Using the proposed compensation system and technique, fewer VCO capacitor banks are needed to cover the same frequency tuning range.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

Based on the block diagram in FIG. 7, the transfer function of the compensation feedback can be derived as:

$$H_{FB}(s) = \frac{i_{comp}}{v_{ctrl}} = \frac{G_{mc} A_V \left( \frac{1}{Z_M} + \frac{1}{Z_{o,d}} \right)}{A_V \left( \frac{1}{Z_M} + G_{mc} \right) + \frac{1}{Z_M} + \frac{1}{Z_{o,d}}}, \quad (10)$$

wherein $Z_M = R_M + 1/(sC_M)$ is the Miller compensation network impedance. Given that $A_V \gg 1$ and $A_V G_{mc} \gg 1/Z_{o,d}$ (e.g., $G_{mc} = 0.1$ mS and $Z_{o,d} = 55$ kΩ in our design), Eqn. (10) can be approximated to:

$$H_{FB}(s) = \frac{i_{comp}}{v_{ctrl}} = \frac{G_{mc} \left( \frac{1}{Z_M} + \frac{1}{Z_{o,d}} \right)}{\frac{1}{Z_M} + G_{mc}}. \quad (11)$$

Defining $\omega_{M1} = 1/(R_M C_M)$, $\omega_{M2} = G_{mc}/C_M$ and $\omega_{M2}$ $1/(Z_{o,d} C_M)$ with our design parameters of $R_M = 500\Omega$, $C_M = 0.5$ pF, Eqn. (11) can be further simplified into:

$$H_{FB}(j\omega) \approx \begin{cases} \frac{1}{Z_{o,d}}, & \omega < \omega_{M3} \\ sC_M, & \omega_{M3} < \omega < \omega_{M2} \\ G_{mc}, & \omega_{M2} < \omega < \omega_{M1} \\ \frac{G_{mc}}{1 + R_M G_{mc}}, & \omega_{M1} < \omega \end{cases} \quad (12)$$

What is claimed is:

1. A compensated charge pump (CP) with current mismatch compensation circuitry that compensates for CP output current mismatch effects in a phase-locked loop (PLL), comprising:
    a charge pump (CP) positioned within a PLL, wherein a phase difference between an input reference and an output of the PLL is converted to a varying voltage that provides an input voltage to the CP, and wherein an output current of the CP is proportionally controlled by the input voltage; and
    a CP compensation structure coupled to the CP, that includes:
        a dummy charge pump (dummy CP) that has the same transistor sizes as the CP and is identically biased with the CP; and
        compensation and feedback circuitry that sense output voltages of the CP and the dummy CP and generate a first compensation current that compensates a first current mismatch between a first CP current and a second CP current of the CP and a second compensation current that compensates a second current mismatch between a first dummy CP current and a second dummy CP current of the dummy CP.

2. The compensated CP of claim 1, wherein:
    the compensation and feedback circuitry include an amplifier, a first current source and a second current source;
    the amplifier is configured to receive the output voltages of the CP and the dummy CP as two inputs, and drive the first current source and the second current source to generate the first compensation current and the second compensation current, respectively; and
    the first current source and the second current source are identical to each other, thereby causing the first compensation current and the second compensation current to be identical.

3. The compensated CP of claim 2, wherein the first current source and the second current source are transconductance current sources.

4. The compensated CP of claim 2, wherein the CP compensation structure further includes a first feedback loop formed by the dummy CP, the amplifier, and the second current source to compensate for the output current mismatch effects associated with the dummy CP using the second compensation current.

5. The compensated CP of claim 4, wherein the first feedback loop is a negative feedback loop.

6. The compensated CP of claim 4, wherein the first feedback loop is operable to force the output voltage of the dummy CP to lock to the output voltage of the CP.

7. The compensated CP of claim 4, wherein the compensated CP further includes a second feedback loop formed by the CP, the amplifier, and the first current source to compensate for the output current mismatch effects associated with the CP using the first compensation current.

8. The compensated CP of claim 7, wherein the first feedback loop is operable to compensate for the output current mismatch effects on the dummy CP when the second feedback loop is disabled.

9. The compensated CP of claim 7, wherein the second feedback loop is operable in conjunction with the first feedback loop to eliminate the effects of the output voltage of the CP on the output current of the CP.

10. The compensated CP of claim 1, wherein the dummy CP is coupled to a high impedance load to ensure the output current of the dummy CP is zero in a steady state, thereby ensuring that the dummy CP does not have a current mismatch in the steady state.

11. The compensated CP of claim 1, wherein during operation of the PLL, when an input differential voltage to the CP is zero, the output current of the CP is ensured to be zero after compensating the CP using the second compensation current.

12. The compensated CP of claim 1, wherein the dummy CP and the CP have an identical current mirroring ratio.

13. The compensated CP of claim 1, wherein the dummy CP and the CP have different output current mirroring ratios.

14. The compensated CP of claim 1, wherein:
the output current of the CP is a function of both the input voltage and the output voltage of the CP prior to being compensated by the first compensation current; and
the output current of the CP is a function of the input voltage of the CP but independent from the output voltage of the CP after being compensated by the first compensation current.

15. The compensated CP of claim 1, wherein the compensation and feedback circuitry further includes stability compensation circuitry coupled between two nodes within the compensation and feedback circuitry and is configured to ensure operation stability and a sufficient phase margin of the compensation and feedback circuitry.

16. The compensated CP of claim 1, wherein the PLL is a sub-sampling PLL, and wherein the CP receives the input voltage from a sub-sampling phase detector (SSPD) coupled to the input of the CP.

17. The compensated CP of claim 1, wherein the CP compensation structure is configured to replicate the output current mismatch effects on the CP to the output current mismatch effects on the dummy CP.

18. A sub-sampling phase-locked loop (SSPLL) including charge pump (CP) current mismatch compensation circuitry that compensates for CP output current mismatch effects in the PLL, the SSPLL comprising:
a sub-sampling phase detector (SSPD) that converts a phase difference between an input reference and an output frequency of the SSPLL into a varying voltage;
a compensated CP coupled to an output of the SSPD, the compensated CP includes:
 a CP coupled to the output of the SSPD to receive the varying voltage as an input voltage to the CP, wherein an output current of the CP is proportionally controlled by the input voltage; and
 a CP current-mismatch-compensation structure coupled to the CP, which includes:
  a dummy charge pump (dummy CP) that has the same transistor sizes as the CP and is identically biased with the CP; and
  compensation and feedback circuitry that senses output voltages of the CP and the dummy CP and generates a first compensation current that compensates a first current mismatch between a first CP current and a second CP current of the CP and a second compensation current that compensates a second current mismatch between a first dummy CP current and a second dummy CP current of the dummy CP.

19. The SSPLL of claim 18, wherein:
the compensation and feedback circuitry includes an amplifier, a first current source, and a second current source;
the amplifier is configured to receive the output voltages of the CP and the dummy CP as two inputs, and drive the first current source and the second current source to generate the first compensation current and the second compensation current, respectively; and
the first current source and the second current source are identical to each other, thereby causing the first compensation current and the second compensation current to be identical.

20. The SSPLL of claim 19, wherein the compensated CP includes:
a first feedback loop formed by the dummy CP, the amplifier, and the second current source to compensate for the output current mismatch effects associated with the dummy CP using the second compensation current; and
a second feedback loop formed by the CP, the amplifier, and the first current source to compensate for the output current mismatch effects associated with the CP using the first compensation current.

21. The SSPLL of claim 20, wherein the first feedback loop is operable to compensate for the output current mismatch effects on the dummy CP during a first time period when the CP and the second feedback loop are disabled, wherein the first time period corresponds to a sampling period of the SSPD.

22. The SSPLL of claim 20, wherein the second feedback loop is operable in conjunction with the first feedback loop to eliminate the effects of the output voltage of the CP on the output current of the CP during a second time period when the CP is activated, wherein the second time period corresponds to a hold period of the SSPD.

23. The SSPLL of claim 20, wherein the first feedback loop is operable to force the output voltage of the dummy CP to lock to the output voltage of the CP.

24. The SSPLL of claim 18, wherein the CP further includes a loop filter configured to convert the output current of the CP into the output voltage of the CP.

25. The SSPLL of claim 24, further comprising a voltage-controlled oscillator (VCO) coupled between the CP and the SSPD, wherein the VCO receives the output voltage of the CP as a control voltage and generates the output frequency of the PLL based on the control voltage.

26. The SSPLL of claim 18, wherein the amplifier compares the output voltage of the CP and the output voltage of the dummy CP, and wherein the different between the output voltage of the CP and the output voltage of the dummy CP is used to generate the first compensation current and the second compensation current.

27. The SSPLL of claim 18, wherein the CP output current mismatch effects include a channel length modulation effect that is proportional to the control voltage.

28. The SSPLL of claim 18, wherein compensating for CP output current mismatch effects in the PLL increases a stability of the SSPD while reducing a gain distortion associated with the SSPD.

29. The SSPLL of claim 18, wherein the compensated CP is configured to replicate output current mismatch effects on the CP to output current mismatch effects on the dummy CP.

* * * * *